(12) United States Patent
Atadana et al.

(10) Patent No.: US 11,935,861 B2
(45) Date of Patent: Mar. 19, 2024

(54) UNDERFILL FLOW MANAGEMENT IN ELECTRONIC ASSEMBLIES

(71) Applicant: Intel Corporation, Santa Clara, CA (US)

(72) Inventors: Frederick W. Atadana, Chandler, AZ (US); Taylor William Gaines, Chandler, AZ (US); Edvin Cetegen, Chandler, AZ (US); Wei Li, Chandler, AZ (US); Hsin-Yu Li, Chandler, AZ (US); Tony Dambrauskas, Chandler, AZ (US)

(73) Assignee: Intel Coropration, Santa Clara, CA (US)

( * ) Notice: Subject to any disclaimer, the term of this patent is extended or adjusted under 35 U.S.C. 154(b) by 811 days.

(21) Appl. No.: 16/862,287

(22) Filed: Apr. 29, 2020

(65) Prior Publication Data

US 2021/0343677 A1    Nov. 4, 2021

(51) Int. Cl.
*H01L 23/00* (2006.01)
*H01L 23/29* (2006.01)
*H01L 23/31* (2006.01)

(52) U.S. Cl.
CPC ............ *H01L 24/32* (2013.01); *H01L 23/293* (2013.01); *H01L 23/3157* (2013.01); *H01L 24/29* (2013.01); *H01L 24/16* (2013.01); *H01L 24/73* (2013.01); *H01L 2224/16227* (2013.01); *H01L 2224/29191* (2013.01); *H01L 2224/32225* (2013.01); *H01L 2224/73204* (2013.01); *H01L 2924/0675* (2013.01); *H01L 2924/0715* (2013.01)

(58) Field of Classification Search
CPC ... H01L 24/32; H01L 23/293; H01L 23/3157; H01L 24/29; H01L 21/563
USPC .......................................................... 257/791
See application file for complete search history.

(56) References Cited

U.S. PATENT DOCUMENTS

2019/0139786 A1* 5/2019 Yeh .................... H01L 23/49833

OTHER PUBLICATIONS

U.S. Appl. No. 16/022,528, filed Jun. 28, 2018, entitled "Micro-Electronic Package With Barrier Structure," First Named Inventor: William Warren.

* cited by examiner

*Primary Examiner* — Jasmine J Clark
(74) *Attorney, Agent, or Firm* — Akona IP PC

(57) ABSTRACT

Disclosed herein are structures and techniques for underfill flow management in electronic assemblies. For example, in some embodiments, an electronic assembly may include a first component, a second component, an underfill on the first component and at least partially between the first component and the second component, and a material at a surface of the first component, wherein the material is outside a footprint of the second component, and the underfill contacts the material with a contact angle greater than 50 degrees.

16 Claims, 7 Drawing Sheets

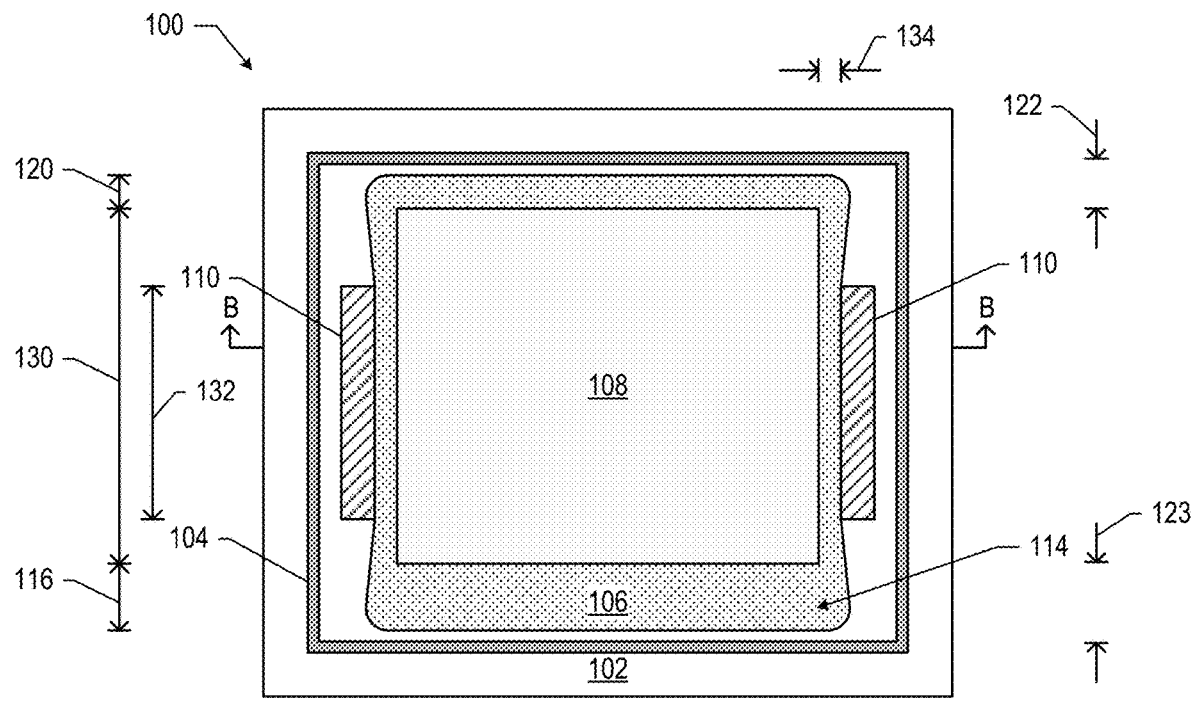
FIG. 1A
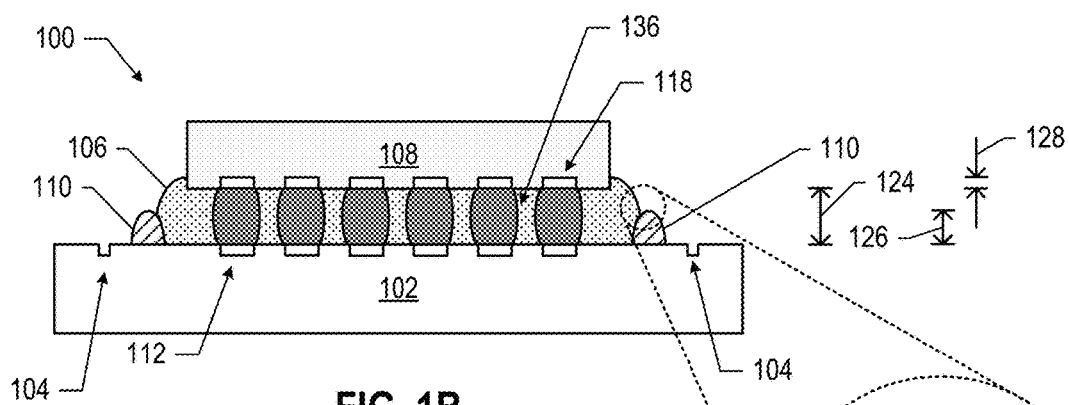
FIG. 1B
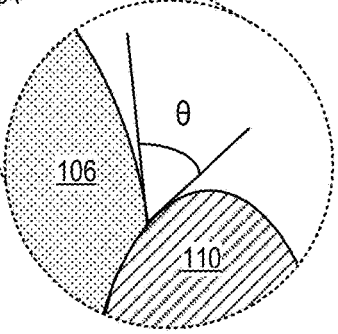

UNDERFILL FLOW MANAGEMENT IN ELECTRONIC ASSEMBLIES

BACKGROUND

When two electronic components (e.g., a die and a package substrate) are coupled together in an assembly, differences in the coefficient of thermal expansion (CTE) between the components may result in different amounts of expansion or contraction of the components when the assembly is heated or cooled. This may cause mechanical stress on the components and/or the joints between them, and may result in cracking, delamination, or other mechanical failures in the assembly.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A and 1B are various views of an example electronic assembly including flow retardant structures, in accordance with various embodiments.

DETAILED DESCRIPTION

Figure 2A:
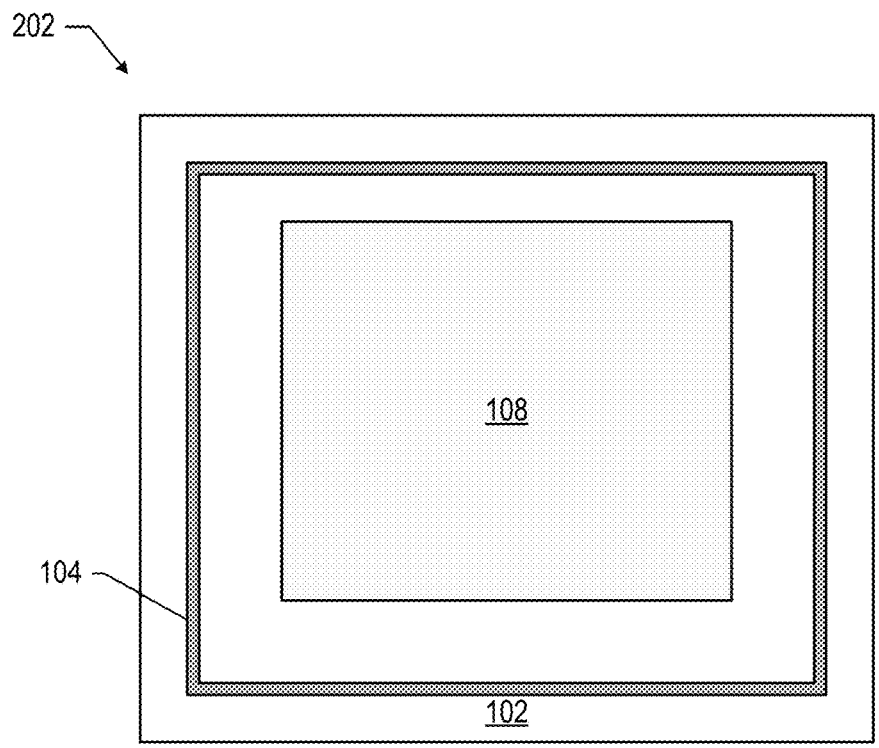
FIGS. 2A-2D illustrate stages in an example process of manufacturing the electronic assembly of FIG. 1, in accordance with various embodiments.

Disclosed herein are structures and techniques for underfill flow management in electronic assemblies. For example, in some embodiments, an electronic assembly may include a first component, a second component, an underfill on the first component and at least partially between the first component and the second component, and a material at a surface of the first component, wherein the material is outside a footprint of the second component, and the underfill contacts the material with a contact angle greater than 50 degrees.

To mitigate the risk of mechanical failure in electronic assemblies in which two components having different coefficients of thermal expansion (CTEs) are coupled together, an underfill may be provided between the two components. The underfill may have a CTE that is between the CTEs of the adjacent components, and thus may decrease the likelihood of thermally induced failure. Further, the underfill may serve to cover and protect the coupling between the components (e.g., solder couplings).

In some manufacturing processes, two components may be coupled together (e.g., via solder), and an initial portion of fluid underfill material (referred to as "the tongue") may be dispensed on a bottom one of the components proximate to a first edge of a top one of the components. Capillary forces may draw the fluid underfill material into the volume between the components, after which the fluid underfill may set or may otherwise be cured. However, in some conventional electronic assemblies, the capillary forces may be strongest proximate to the edges of the top component, and the flow of the fluid underfill material may thus be faster proximate to the edges of the top component (and slower proximate to the center of the top component). The resulting underfill flow front may thus be U-shaped, with the center of the flow front lagging the edges of the flow front. When this front gets close to a second edge of the top component, opposite to the bottom edge, the faster edges of the flow front may meet each other, trapping air ahead of the slower center of the flow front, and resulting in a void in the underfill in the final electronic assembly. The presence of underfill voids increases the likelihood of mechanical failures relative to void-free underfill, and may result in a less reliable assembly (or an assembly that must be discarded or reworked). Voids resulting from the faster flows of fluid underfill material at the edges of the flow front have also precluded the adoption of a "two-sided" underfill dispense process in which initial portions of fluid underfill material are dispensed at opposite edges of the top component and drawn under the top component by capillary forces at the same time; faster edge flows in such a process may result in especially large voids formed under the center of the top component when the edges of the two flow fronts meet. Attempts to mitigate the presence of voids by changing the formulation of the underfill material (e.g., to increase surface tension) have typically had a negative impact on the thermal performance of the underfill material and/or its adhesion.

The structures and techniques for underfill flow management disclosed herein may reduce the risk of underfill voids relative to conventional approaches, and thus may increase the reliability of the resulting assemblies (as well as increasing the throughput of methods of manufacturing such assemblies). Further, the structures and techniques disclosed herein may enable the use of a two-sided underfill dispense process with a lower likelihood of void formation relative to conventional approaches, and thus may allow the manufacturing of such assemblies to be speeded up relative to conventional single-sided processes. Additionally, the structures and techniques disclosed herein do not require (undesirable) changes in the formulation of the underfill material.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 2" may be used to refer to the collection of drawings of FIGS. 2A-2D, etc.

FIG. 1 illustrates an example electronic assembly 100 including flow retardant structures 110. In particular, FIG. 1A is a top view of an electronic assembly 100, and FIG. 1B is a side, cross-sectional view of the electronic assembly 100 through the section B-B of FIG. 1A. FIG. 1B also includes a detailed view of a portion of the electronic assembly 100, as indicated by the dotted circles.

An electronic assembly 100 may include a bottom component 102 and a top component 108. The terms "bottom" and "top," as used herein with reference to the bottom component 102 and the top component 108, are used only for readability purposes, and should not imply any necessary orientation of the components 102 and 108. The bottom component 102 and the top component 108 may be any suitable electronic components. For example, in some embodiments, the top component 108 may be a die and the bottom component 102 may be a package substrate, the top component 108 may be a die and the bottom component 102 may be an interposer, the top component 108 may be an interposer and the bottom component 102 may be a package substrate, the top component 108 and the bottom component 102 may both be dies, the top component 108 and the bottom component 102 may both be interposers, etc. Various examples of bottom components 102 and top components 108 are also discussed below with reference to FIGS. 5-9.

The bottom component 102 may be coupled to the top component 108. For example, FIG. 1 illustrates conductive contacts 112 of the bottom component 102 that are coupled to conductive contacts 118 of the top component 108 by solder 136. This particular coupling is simply illustrative, and the bottom component 102 may be coupled to the top component 108 using any suitable structures. The coupling between the bottom component 102 and the top component 108 may be both mechanical and electrical (e.g., with electrical pathways between the top component 108 and the bottom component 102 provided by the conductive contacts 118/solder 136/conductive contacts 112). The top component 108 may include passive devices (e.g., resistors, inductors, capacitors, etc.), active devices (e.g., transistors, diodes, etc.), and/or electrical pathways (e.g., electrical pathways between passive devices, active devices, and the conductive contacts 118, as desired), and any other desired elements. The top component 108 may also include additional conductive contacts (e.g., on a face of the top component 108 opposite to the face at which the conductive contacts 118 are disposed), not shown. The bottom component 102 may include passive devices (e.g., resistors, inductors, capacitors, etc.), active devices (e.g., transistors, diodes, etc.), and/or electrical pathways (e.g., electrical pathways between passive devices, active devices, and the conductive contacts 112, as desired), and any other desired elements. The bottom component 102 may also include additional conductive contacts (e.g., on a face of the bottom component 102 opposite to the face at which the conductive contacts 112 are disposed), not shown. Further elements (e.g., surface-mount devices or other elements, a lid coupled to the bottom component 102 via a sealant, etc.), not shown, may be coupled to the bottom component 102 and/or the top component 108 of an electronic assembly 100.

An underfill 106 may be disposed between the bottom component 102 and the top component 108, and may extend further onto the surface of the bottom component 102, outside the footprint of the top component 108, as shown. The underfill 106 may include any suitable material, such as an epoxy material. For example, in some embodiments, the underfill 106 may be an epoxy-amine, while in other embodiments, the underfill 106 may be an epoxy-anhydride. The underfill 106 may contact the bottom component 102 and the top component 108, as well as the solder 136 (or other material or structure coupling the bottom component 102 and the top component 108), as shown. In some embodiments, the underfill 106 may contact side faces of the top component 108, as shown. The underfill 106 may include a tongue 114; the tongue 114 may reflect the location at which the fluid underfill 106 is initially provided before the fluid underfill 106 is wicked into the volume between the bottom component 102 and the top component 108 by capillary action, as discussed above. The tongue 114 may be identified in the electronic assembly 100 as being the region of the underfill 106 that extends farthest from the proximate side face of the top component 108; in FIG. 1A, the tongue 114 may extend away from the proximate side face of the top component 108 by a distance 116 that is greater, for example, than the distance 120 by which the underfill 106 extends away from the opposing proximate side face of the top component 108. In some embodiments, the distance 116 may be greater than or equal to twice the distance 120, or greater than or equal to three times the distance 120.

Flow retardant structures 110 may be disposed on the bottom component 102, and may be in contact with the underfill 106. In some embodiments, flow retardant structures 110 may be manufactured integrally with the rest of the bottom component 102, while in other embodiments (e.g., those discussed below with reference to FIG. 2), the flow retardant structures 110 may be formed on a surface of the bottom component 102 after the bottom component 102 is otherwise manufactured. The flow retardant structures 110 may include a material whose proximity to the fluid underfill 106 during manufacturing causes the proximate fluid underfill 106 to slow its capillary flow between the bottom component 102 and the top component 108. In particular, the presence of the flow retardant structures 110 may cause the edges of the flow front of the fluid underfill 106 to slow down relative to the speed of the edges of the flow front of the fluid underfill 106 when the flow retardant structures 110 are not present. The flow retardant structures 110 may slow the edges of the flow front of the fluid underfill 106 sufficiently so as to substantially equalize the rate of flow between the edges of the flow front and the center of the flow front, resulting in a more uniform front and reducing the likelihood of void formation. In some embodiments, the flow retardant structures 110 may slow the edges of the flow front of the fluid underfill 106 sufficiently so as to make the rate of flow of the edges of the flow front less than the rate of flow at the center of the flow front. The use of the flow retardant structures 110 for control of fluid underfill 106 is discussed further below with reference to FIG. 2. It is noted that the use of flow retardant structures 110 may result in a longer flow time than that required for conventional approaches, and thus some embodiments of the present disclosure may represent a tradeoff between reduced voids and shorter flow times.

In some embodiments, the material of the flow retardant structures 110 may be selected so as to have a poor wetting interaction with the fluid underfill 106, resulting in a local velocity reduction of the flow front of the underfill 106. In some embodiments, the material of the flow retardant structures 110 may have a relatively high contact angle with the underfill 106. For example, as shown in FIG. 1B, in some embodiments, the contact angle A between a flow retardant structure 110 and the underfill 106 may be greater than 50 degrees (e.g., greater than or equal to 60 degrees). In some embodiments, the surface energy of the material of the flow retardant structures 110 may be less than 40 dynes per centimeter (e.g., less than 30 dynes per centimeter). Examples of materials that may be used in the flow retardant structures 110 may include silicones, polyurethanes, polyolefins, fluorinated elastomers, fluorinated polyolefins, rubber-like materials, or other suitable materials (e.g., materials including silicone particle additives and/or materials using high surface energy treatments). The flow retardant structures 110 may be formed of a single material (e.g., any of the materials discussed previously), or multiple materials, as desired. The particular materials and/or arrangement of materials may be selected to provide the amount of velocity reduction desired in a particular application. In some embodiments, the flow retardant structures 110 may have a rounded profile, as shown. In some embodiments, the flow retardant structures 110 may be formed of a dielectric material.

As shown in FIG. 1, flow retardant structures 110 may be positioned so as to be outside the footprint of the top component 108 and proximate to opposing side faces of the top component 108. The tongue 114 of the underfill 106 may be located proximate to another side face of the top component 108 so that the flow retardant structures 110 slow the edges of the fluid underfill 106 flow front from the tongue 114 to the other side of the top component 108. In some embodiments, the flow retardant structures 110 may have a substantially linear form, as shown, although other shapes may be used as desired. The length 132 of a flow retardant structure 110 may be selected so as to achieve a desired amount of velocity reduction at the edges of the flow front of the fluid underfill 106, without resulting in excessive slowing that would extend the manufacturing time beyond a desired amount. In some embodiments, the length 132 of a flow retardant structure 110 may be less than the length 130 of the proximate side face of the top component 108. For example, in some embodiments, the length 132 of a flow retardant structure 110 may be less than or equal to one-half the length 130 of the proximate side face of the top component 108, or may be less than or equal to one-third the length 130 of the proximate side face of the top component 108.

In some embodiments, a trench 104 may be disposed in the face of the bottom component 102 to which the top component 108 is coupled. The trench 104 may be a shallow recess that surrounds the footprint of the top component 108 and serves as a boundary for the spread of the underfill 106. The footprint of the top component 108 may not be centered with respect to the footprint of the trench 104. Instead, the trench 104 and the top component 108 may be dimensioned and relatively positioned to account for the tongue 114 so that there is more distance between the trench 104 and the side face of the top component 108 proximate to the tongue 114 of the underfill 106 than proximate to other side faces of top component 108, as shown. In some embodiments, no trench 104 may be present.

The dimensions of an electronic assembly 100 may take any suitable values. For example, the flow retardant structures 110 may be spaced away from the footprint of the top component 108 by a distance 134 that is between 0.5 millimeters and 2 millimeters (e.g., between 0.5 millimeter and 1 millimeter). The distance 134 may be selected so as to reduce the risk that the flow retardant structures 110 will inadvertently contact the top component 108 (e.g., due to limits on achievable positioning precision). In some embodiments, the minimum distance 122 between a side face of the top component 108 and the trench 104 may be between 1 millimeter and 3 millimeters (e.g., between 1.5 millimeters and 2.2 millimeters), while the distance 123 between the side face of the top component 108 and the trench 104 proximate to the tongue 114 may be between 3 millimeters and 5 millimeters. In some embodiments, the underfill 106 may extend onto side faces of the top component 108 by a distance 128 that is less than 800 microns (e.g., less than 700 microns, or less than 600 microns). The height 126 of the flow retardant structures 110 may be less than the distance 124 between the bottom component 102 and the top component 108. In some embodiments, the distance 124 may be between 1 millimeter and 4.2 millimeters.

FIGS. 2A-2D illustrates stages in an example process of manufacturing the electronic assembly 100 of FIG. 1, in accordance with various embodiments. Although the operations of the process of FIG. 2 (and the process of FIG. 4, discussed below) may be illustrated with reference to particular embodiments of the electronic assemblies 100 and flow retardant structures 110 disclosed herein, the process of FIG. 2 (and the process of FIG. 4, discussed below) may be used to form any suitable electronic assembly 100 or flow retardant structure 110. Operations are illustrated once each and in a particular order with respect to FIG. 2 (and with respect to FIG. 4, discussed below), but the operations may be reordered and/or repeated as desired (e.g., with different operations performed in parallel when manufacturing multiple electronic assemblies 100 simultaneously).

FIG. 2A is a top view of an assembly 202 including the bottom component 102 (which may include a trench 104) and the top component 108 coupled thereto (e.g., by solder 136, as discussed above with reference to FIG. 1). The assembly 202 may be formed using any suitable attach process (e.g., a die attach process, as suitable).

Figure 2B:
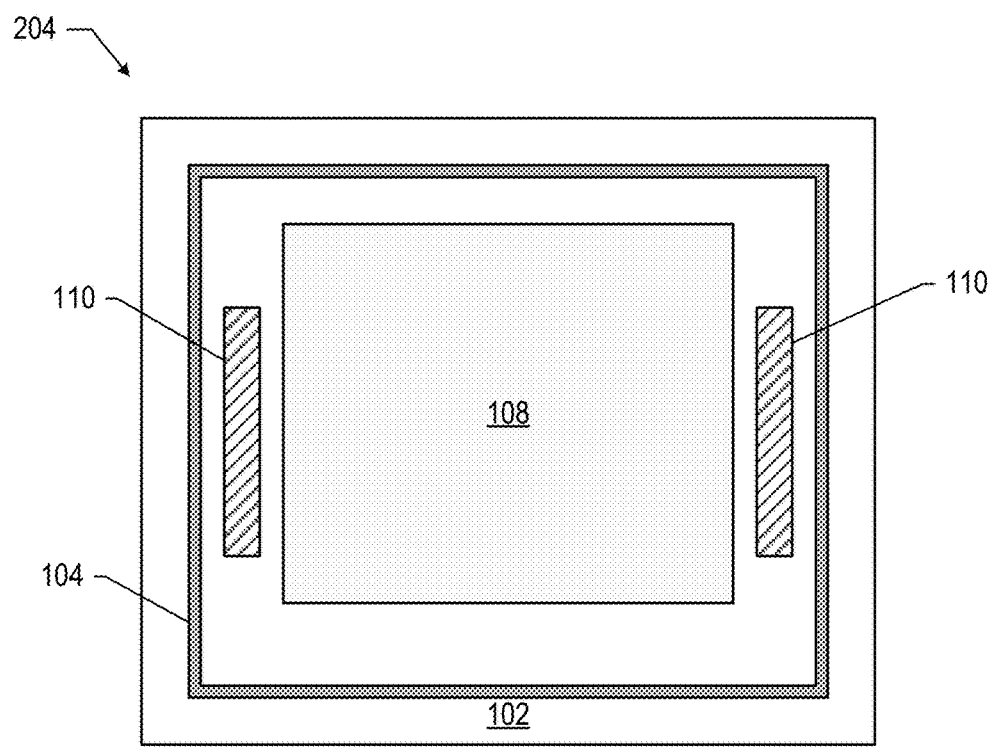

FIG. 2B is a top view of an assembly 204 subsequent to forming the flow retardant structures 110 on the bottom component 102 of the assembly 202 (FIG. 2A). In some embodiments, the flow retardant structures 110 may be formed by dispensing a fluid form of the material of the flow retardant structures 110, and then allowing the fluid material to set (or otherwise curing the fluid material). The flow retardant structures 110 may alternately be preformed, and then adhered or otherwise attached to the bottom component 102. Any suitable method of forming the flow retardant structures 110 (before or after the attachment of the bottom component 102 to the top component 108) may be used.

Figure 2C:
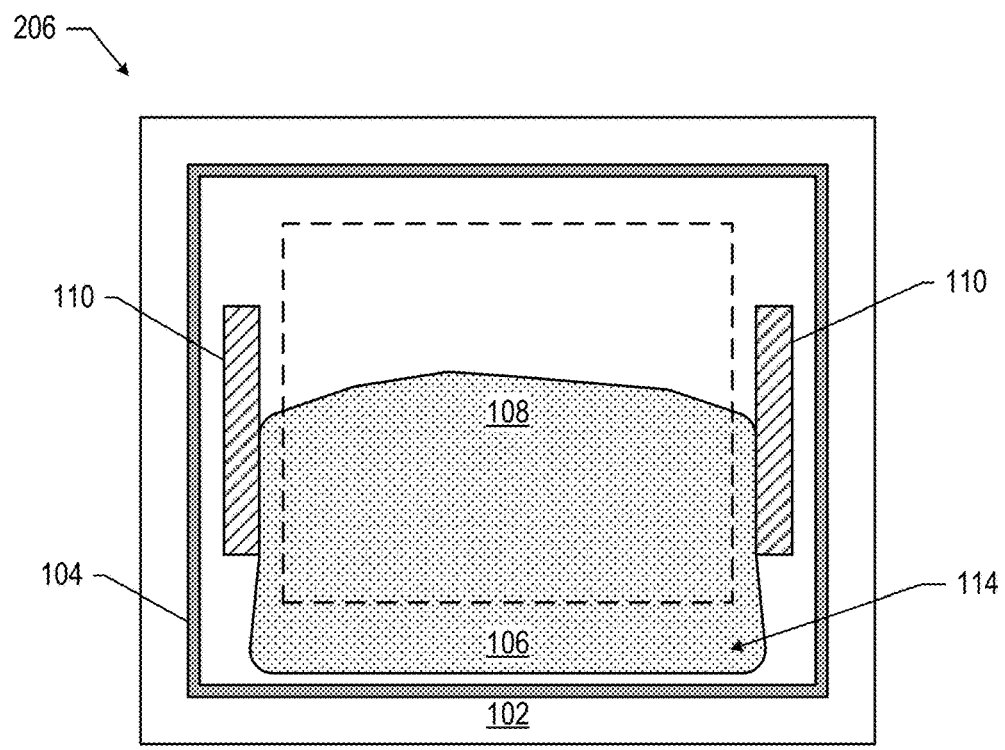

FIG. 2C is a top view of an assembly 206 subsequent to dispensing an initial amount of fluid underfill 106 (forming the tongue 114) on the bottom component 102 of the assembly 204 (FIG. 2B) and allowing the fluid underfill 106 to be wicked into the volume between the bottom component 102 and the top component 108. In FIG. 2C (and FIGS. 2D, 4A, and 4B, discussed below), the top component 108 is illustrated with a dashed line to permit viewing of the flow front of the underfill 106 underneath. As shown in FIG. 2C, the interaction between the flow retardant structures 110 and the underfill 106 may cause the edges of the flow front to slow down (relative to embodiments in which no flow retardant structures 110 are present), resulting in a more uniform flow front (e.g., one in which the center of the flow moves at a speed approximately equal to or faster than the edges of the flow).

Figure 2D:
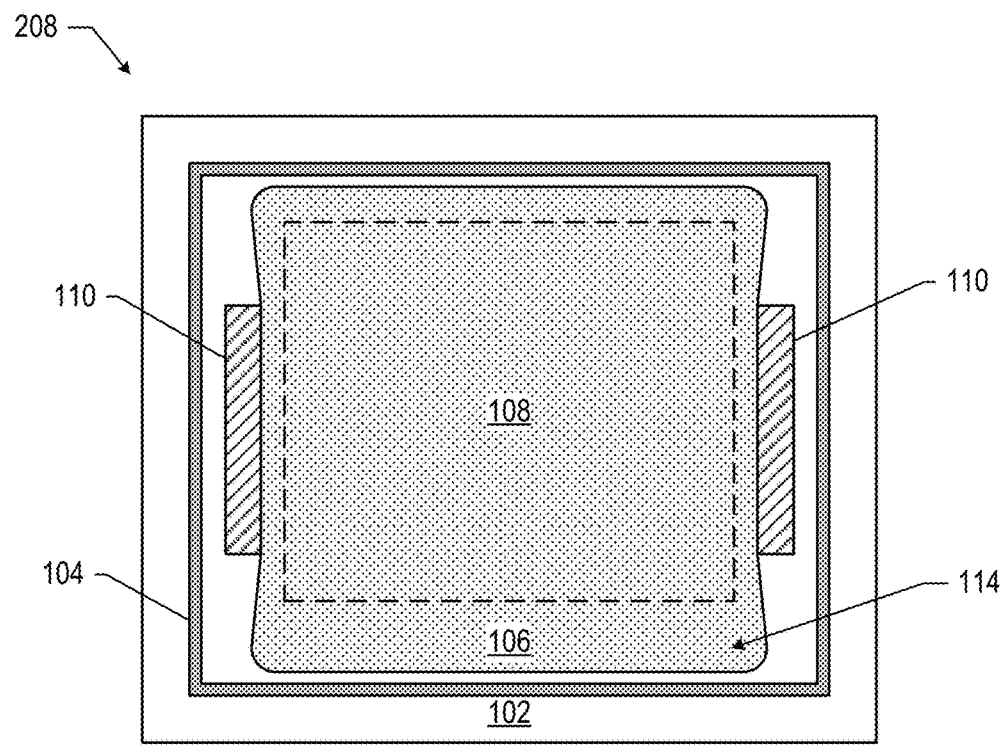

FIG. 2D is a top view of an assembly 208 subsequent to completing the flow of the fluid underfill 106 of the assembly 206 (FIG. 2C) and allowing the fluid underfill 106 to set or otherwise curing the fluid underfill 106. The resulting assembly 208 may take the form of the electronic assembly 100 of FIG. 1.

Figure 3:
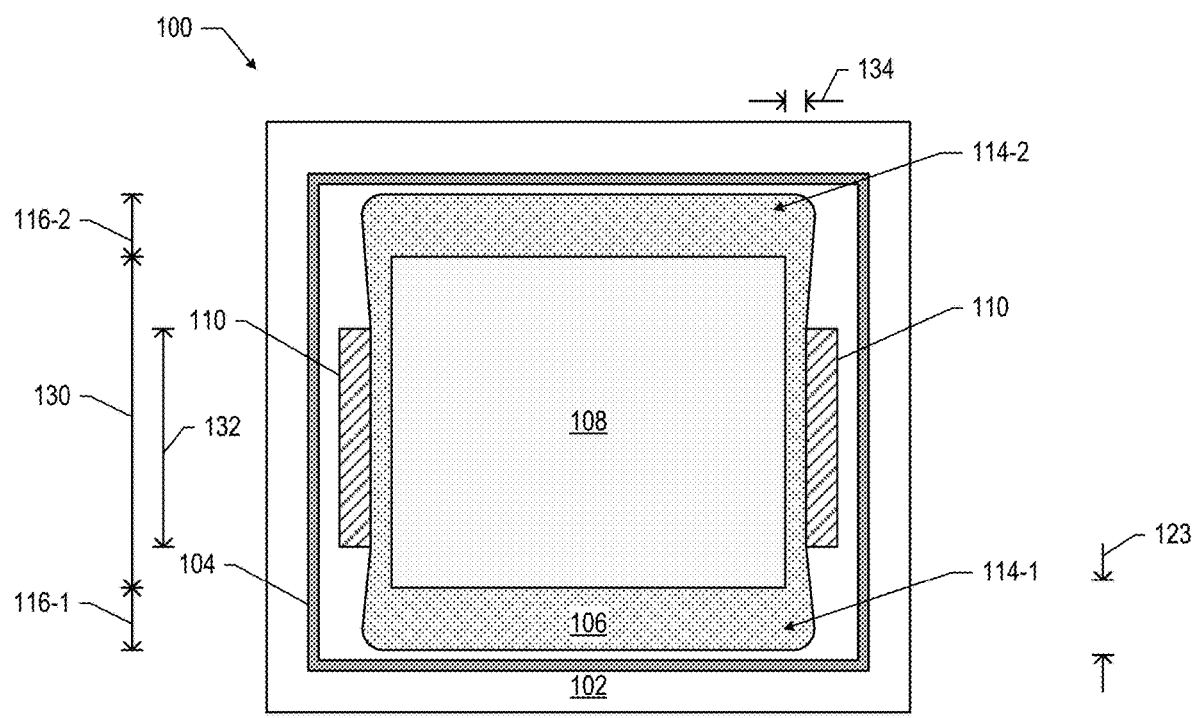
FIG. 3 is a top view of another example electronic assembly including flow retardant structures, in accordance with various embodiments.

As noted above, the flow retardant structures 110 may enable the use of a two-sided dispense process for the underfill 106. Such a two-sided process may reduce the amount of time required to flow the underfill 106 relative to a single-sided process (e.g., the process of FIG. 2), and the flow retardant structures 110 may control the velocity of the edges of the flow front of the underfill 106 to achieve a two-sided dispense process with low or no risk of undesirable voids. FIG. 3 is a top view of another example electronic assembly 100 including flow retardant structures 110, in accordance with various embodiments. The embodiment of FIG. 3 shares many of its elements with the embodiment of FIG. 1; these elements may take any of the forms disclosed herein, and discussion of these elements is not repeated. In contrast to the embodiment of FIG. 1, the electronic assembly 100 of FIG. 3 may include two tongues 114 of underfill 106 (labeled 114-1 and 114-2) proximate to opposite side faces of the top component 108. In an embodiment like that of FIG. 3, the footprint of the top component 108 may indeed be centered with respect to the trench 104 (when present). A side, cross-sectional view of the electronic assembly 100 of FIG. 3 may take the form illustrated in FIG. 1B.

Figure 4A:
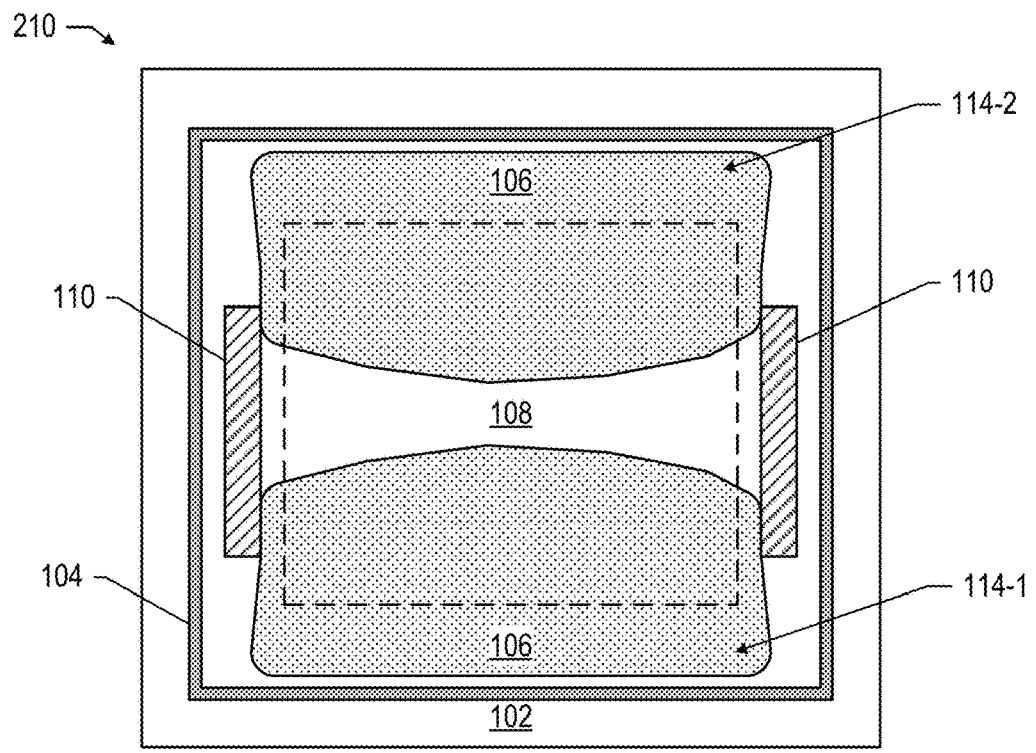
FIGS. 4A-4B illustrate stages in an example process of manufacturing the electronic assembly of FIG. 3, in accordance with various embodiments.
Figure 4B:
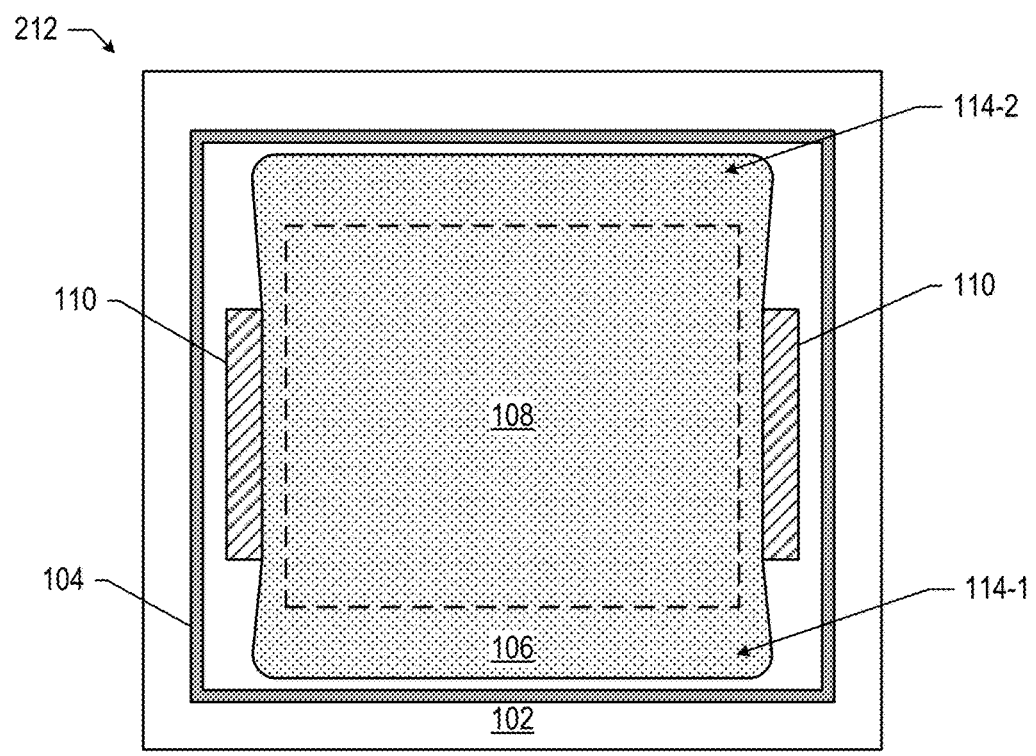

FIGS. 4A-4B illustrates stages in an example process of manufacturing the electronic assembly 100 of FIG. 3, in accordance with various embodiments. The manufacture of the electronic assembly 100 of FIG. 3 may begin with the operations discussed above with reference to FIGS. 2A and 2B. FIG. 4A is a top view of an assembly 210 subsequent to dispensing two initial portions of fluid underfill 106 (forming the tongues 114-1 and 114-2) on the bottom component 102 of the assembly 204 (FIG. 2B), proximate to opposite side faces of the top component 108, and allowing the fluid underfill 106 to be wicked into the volume between the bottom component 102 and the top component 108. As shown in FIG. 4A, the interaction between the flow retardant structures 110 and the underfill 106 may cause the edges of the flow front originating at the tongues 114-1 and 114-2 to slow down (relative to embodiments in which no flow retardant structures 110 are present), resulting in more uniform flow fronts (e.g., ones in which the center of the flows move at a speed approximately equal to or faster than the edges of the flows), and thus a reduced likelihood of voids when the two flow fronts meet.

FIG. 4B is a top view of an assembly 212 subsequent to completing the flow of the fluid underfill 106 of the assembly 210 (FIG. 4A) and allowing the fluid underfill 106 to set or otherwise curing the fluid underfill 106. The resulting assembly 212 may take the form of the electronic assembly 100 of FIG. 3.

The electronic assemblies 100 and flow retardant structures 110 disclosed herein may be included in any suitable electronic component. FIGS. 5-9 illustrate various examples of apparatuses that may include any of the electronic assemblies 100 disclosed herein, or may be included in any of the electronic assemblies 100 disclosed herein.

Figure 5:
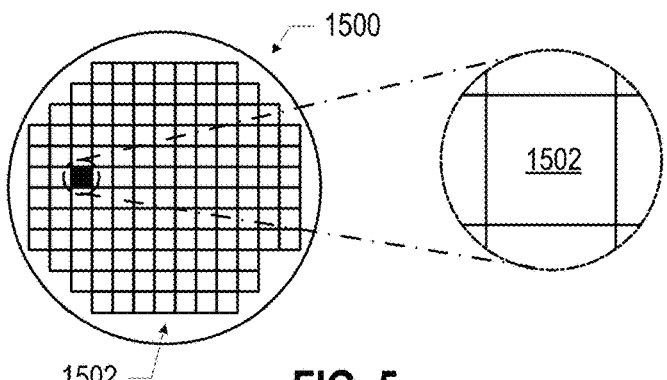
FIG. 5 is a top view of a wafer and dies that may be included in an electronic assembly in accordance with any of the embodiments disclosed herein.

FIG. 5 is a top view of a wafer 1500 and dies 1502 that may be included in any of the electronic assemblies 100 disclosed herein. For example, a die 1502 may serve as the bottom component 102 or the top component 108 of any of the electronic assemblies 100 disclosed herein. The wafer 1500 may be composed of semiconductor material and may include one or more dies 1502 having integrated circuit (IC) structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 6, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 9) or other logic that is configured to store information in the memory devices or execute instructions stored in the memory array.

Figure 6:
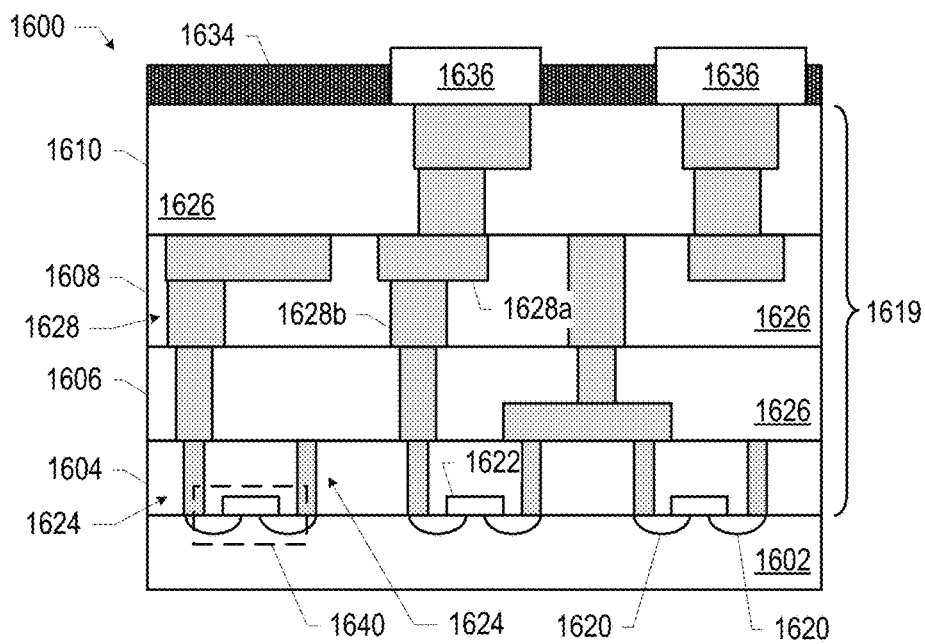
FIG. 6 is a side, cross-sectional view of an integrated circuit (IC) device that may be included in an electronic assembly in accordance with any of the embodiments disclosed herein.

FIG. 6 is a side, cross-sectional view of an IC device 1600 that may be included in an electronic assembly 100 in accordance with any of the embodiments disclosed herein. For example, the IC device 1600 may be included in the bottom component 102 or the top component 108 of any of the electronic assemblies 100 disclosed herein. One or more of the IC devices 1600 may be included in one or more dies 1502 (FIG. 5). The IC device 1600 may be formed on a substrate 1602 (e.g., the wafer 1500 of FIG. 5) and may be included in a die (e.g., the die 1502 of FIG. 5). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 5) or a wafer (e.g., the wafer 1500 of FIG. 5).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 6 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 6 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 6). Although a particular number of interconnect layers 1606-1610 is depicted in FIG. 6, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 6. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 6. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 6, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 7:
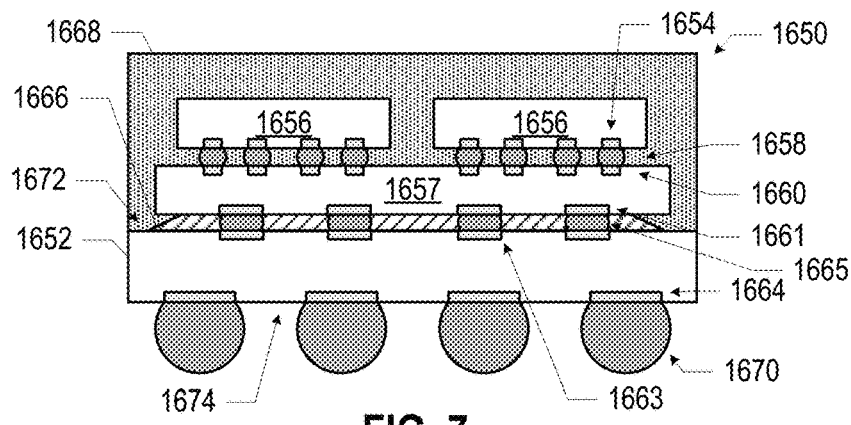
FIG. 7 is a side, cross-sectional view of an IC package that may include an electronic assembly in accordance with various embodiments.

FIG. 7 is a side, cross-sectional view of an example IC package 1650 that may include any of the electronic assemblies 100 disclosed herein. For example, the package substrate 1652 may serve as the bottom component 102, and the interposer 1657 may serve as the top component 108. In another example, the interposer 1657 may serve as the bottom component 102, and one or more of the dies 1656 may serve as the top component 108. In another example in which the interposer 1657 is omitted, the package substrate 1656 may serve as the bottom component 102 and one or more of the dies 1656 may serve as the top component 108. In some embodiments, the IC package 1650 may be a system-in-package (SiP).

The package substrate 1652 may be formed of a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 6.

The package substrate 1652 may include conductive contacts 1663 that are coupled to conductive pathways (not shown) through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 7 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665. More generally, one or more dies 1656 may be coupled to the package substrate 1652 via any suitable structure (e.g., (e.g., a silicon bridge, an organic bridge, one or more waveguides, one or more interposers, wirebonds, etc.).

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 7 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 7 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 8.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory).

Although the IC package 1650 illustrated in FIG. 7 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 7, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 8:
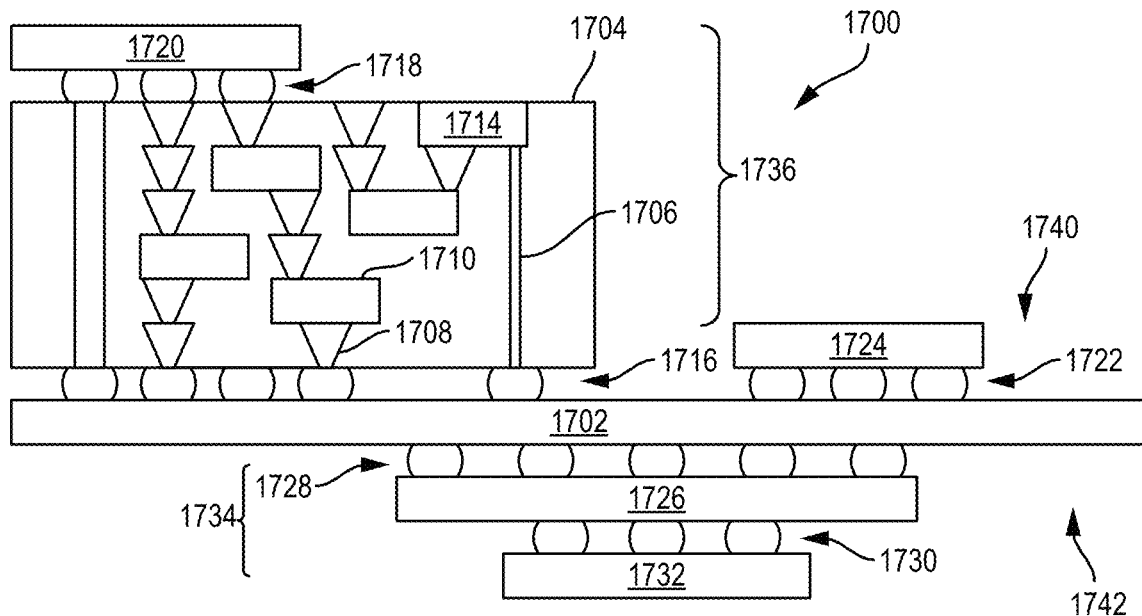
FIG. 8 is a side, cross-sectional view of an IC device assembly that may include an electronic assembly in accordance with any of the embodiments disclosed herein.

FIG. 8 is a side, cross-sectional view of an IC device assembly 1700 that may include one or more electronic assemblies 100 in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 7 (e.g., may include one or more flow retardant structures 110 on a package substrate 1652 or an interposer 1657).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 8 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 8), male and female portions of a socket, an adhesive, an underfill material, and/or any other suitable electrical and/or mechanical coupling structure.

The package-on-interposer structure 1736 may include an IC package 1720 coupled to an package interposer 1704 by coupling components 1718. The coupling components 1718 may take any suitable form for the application, such as the forms discussed above with reference to the coupling components 1716. Although a single IC package 1720 is shown in FIG. 8, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 5), an IC device (e.g., the IC device 1600 of FIG. 6), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 8, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more flow retardant structures 110.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 8 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 9:
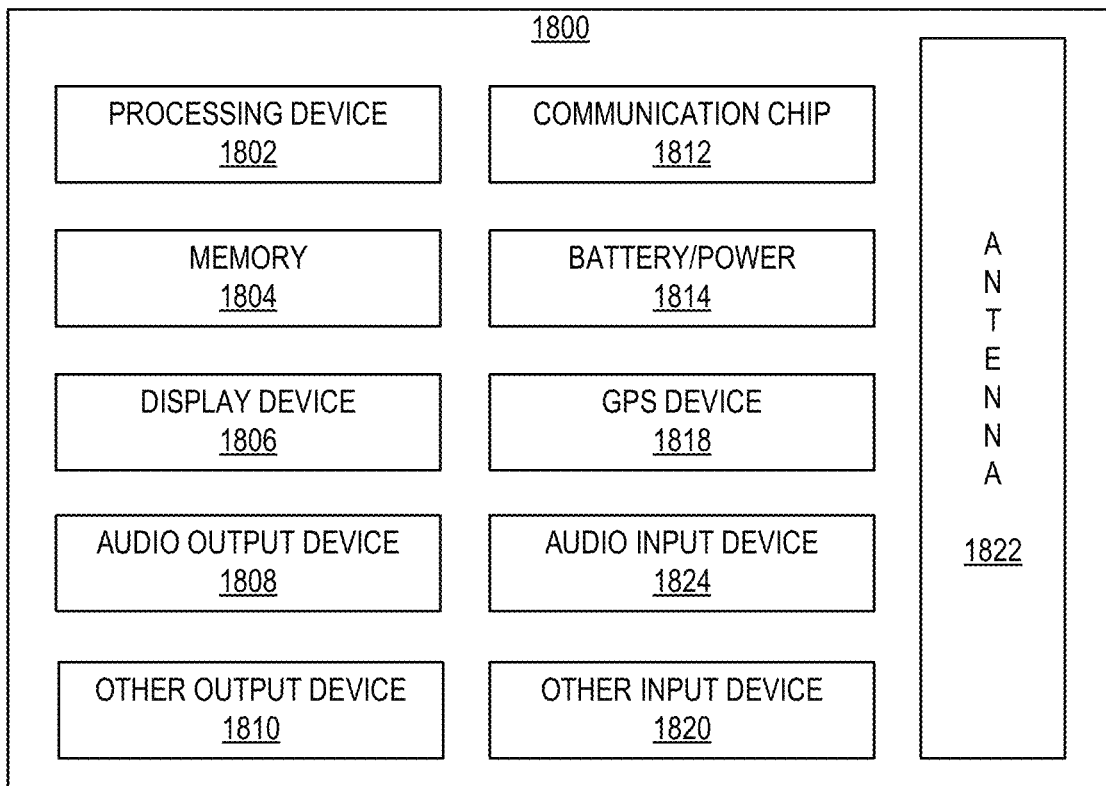
FIG. 9 is a block diagram of an example electrical device that may include an electronic assembly in accordance with any of the embodiments disclosed herein.

FIG. 9 is a block diagram of an example electrical device 1800 that may include one or more electronic assemblies 100 in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 9 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 9, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an electronic assembly, including: a first component; a second component; an underfill on the first component and at least partially between the first component and the second component; and a material at a surface of the first component, wherein the material is outside a footprint of the second component, and the underfill contacts the material with a contact angle greater than 50 degrees.

Example 2 includes the subject matter of Example 1, and further specifies that the contact angle is greater than or equal to 60 degrees.

Example 3 includes the subject matter of any of Examples 1-2, and further specifies that the material includes a silicone, a polyurethane, a polyolefin, or an elastomer.

Example 4 includes the subject matter of Example 3, and further specifies that the material includes fluorine.

Example 5 includes the subject matter of any of Examples 1-4, and further specifies that the underfill includes an epoxy.

Example 6 includes the subject matter of Example 5, and further specifies that the underfill includes an epoxy-amine or an epoxy-anhydride.

Example 7 includes the subject matter of any of Examples 1-6, and further specifies that the material has a surface energy that is less than 40 dynes per centimeter.

Example 8 includes the subject matter of Example 7, and further specifies that the material has a surface energy that is less than 30 dynes per centimeter.

Example 9 includes the subject matter of any of Examples 1-8, and further specifies that the second component has a side surface and the material is proximate to the side surface.

Example 10 includes the subject matter of Example 9, and further specifies that the material is arranged in a line that is parallel to at least some of the side surface.

Example 11 includes the subject matter of Example 10, and further specifies that the line has a length that is a less than a length of the side surface.

Example 12 includes the subject matter of Example 11, and further specifies that the length of the line is less than or equal to one-half the length of the side surface.

Example 13 includes the subject matter of Example 11, and further specifies that the length of the line is less than or equal to one-third the length of the side surface.

Example 14 includes the subject matter of any of Examples 9-13, and further specifies that the line is spaced away from a footprint of the side surface by a distance between 0.5 millimeters and 1 millimeter.

Example 15 includes the subject matter of any of Examples 1-8, and further specifies that the second component has a first side surface and an opposing second side surface, the material includes a first portion and a second portion, the first portion is proximate to the first side surface, and the second portion is proximate to the second side surface.

Example 16 includes the subject matter of Example 15, and further specifies that the first portion is arranged in a line that is parallel to at least some of the first side surface, and the second portion is arranged in a line that is parallel to at least some of the second side surface.

Example 17 includes the subject matter of Example 16, and further specifies that the first portion has a length that is a less than a length of the first side surface, and the second portion has a length that is less than a length of the second side surface.

Example 18 includes the subject matter of Example 17, and further specifies that the length of the first portion is less than or equal to one-half the length of the first side surface, and the length of the second portion is less than or equal to one-half the length of the second side surface.

Example 19 includes the subject matter of Example 17, and further specifies that the length of the first portion is less than or equal to one-third the length of the first side surface, and the length of the second portion is less than or equal to one-third the length of the second side surface.

Example 20 includes the subject matter of any of Examples 15-19, and further specifies that the first portion is spaced away from a footprint of the first side surface by a distance between 0.5 millimeters and 1 millimeter, and the second portion is spaced away from a footprint of the second side surface by a distance between 0.5 millimeters and 1 millimeter.

Example 21 includes the subject matter of any of Examples 15-20, and further specifies that the first portion and the second portion are parallel.

Example 22 includes the subject matter of any of Examples 1-21, and further specifies that the material does not surround the footprint of the second component.

Example 23 includes the subject matter of any of Examples 1-22, and further specifies that the underfill includes a tongue portion outside a footprint of the second component.

Example 24 includes the subject matter of Example 23, and further specifies that the material includes a first portion and a second portion, an end of the first portion is proximate to a first side of the tongue portion, and an end of the second portion is proximate to a second side of the tongue portion.

Example 25 includes the subject matter of any of Examples 23-24, and further specifies that the tongue portion is a first tongue portion, and the underfill includes a second tongue portion opposite to the first tongue portion.

Example 26 includes the subject matter of Example 25, and further specifies that the material includes a first portion and a second portion, an end of the first portion is proximate to a first side of the second tongue portion, and an end of the second portion is proximate to a second side of the second tongue portion.

Example 27 includes the subject matter of any of Examples 1-26, and further includes: a trench at a surface of the first component, wherein the trench surrounds the footprint of the second component, and the material is between the trench and the footprint of the second component.

Example 28 includes the subject matter of Example 27, and further specifies that the footprint of the second component is not centered within a perimeter of the trench.

Example 29 includes the subject matter of any of Examples 27-28, and further specifies that the footprint of the second component is spaced apart from a first proximate portion of the trench by a first distance, the footprint of the second component is spaced apart from a second proximate portion of the trench by a second distance, the first distance is less than the second distance, and the material is between the footprint of the second component and the first proximate portion of the trench.

Example 30 includes the subject matter of any of Examples 1-29, and further specifies that the first component is a package substrate or an interposer.

Example 31 includes the subject matter of any of Examples 1-30, and further specifies that the second component is a die or an interposer.

Example 32 includes the subject matter of any of Examples 1-31, and further includes: a lid coupled to the second component by a sealant different from the material.

Example 33 includes the subject matter of any of Examples 1-32, and further includes: a third component coupled to the surface of the first component, wherein the underfill does not extend between the third component and the first component.

Example 34 includes the subject matter of any of Examples 1-33, and further specifies that the first component is coupled to the second component by solder.

Example 35 includes the subject matter of any of Examples 1-34, and further includes: a mold compound over the second component, wherein the mold compound contacts the material.

Example 36 includes the subject matter of any of Examples 1-35, and further specifies that the material is a flow retardant material.

Example 37 includes the subject matter of any of Examples 1-36, and further specifies that the electronic assembly includes an integrated circuit package.

Example 38 includes the subject matter of any of Examples 1-37, and further includes: a circuit board, wherein the second component is electrically coupled to the circuit board.

Example 39 includes the subject matter of Example 38, and further specifies that the circuit board is a motherboard.

Example 40 includes the subject matter of any of Examples 38-39, and further includes: a display communicatively coupled to the circuit board.

Example 41 includes the subject matter of any of Examples 38-40, and further includes: one or more antennas communicatively coupled to the circuit board.

Example 42 includes the subject matter of any of Examples 1-41, and further specifies that the electronic assembly includes a server computing device, a laptop computing device, a tablet computing device, a wearable computing device, or a handheld computing device.

Example 43 is an electronic assembly, including: a first component; a second component; an underfill on the first component and at least partially between the first component and the second component; and a material at a surface of the first component, wherein the material is outside a footprint of the second component, the material does not surround the footprint of the second component, and the underfill contacts the material.

Example 44 includes the subject matter of Example 43, and further specifies that the underfill contacts the material with a contact angle greater than 50 degrees.

Example 45 includes the subject matter of Example 44, and further specifies that the contact angle is greater than or equal to 60 degrees.

Example 46 includes the subject matter of any of Examples 43-45, and further specifies that the material includes a silicone, a polyurethane, a polyolefin, or an elastomer.

Example 47 includes the subject matter of Example 46, and further specifies that the material includes fluorine.

Example 48 includes the subject matter of any of Examples 43-47, and further specifies that the underfill includes an epoxy.

Example 49 includes the subject matter of Example 48, and further specifies that the underfill includes an epoxy-amine or an epoxy-anhydride.

Example 50 includes the subject matter of any of Examples 43-49, and further specifies that the material has a surface energy that is less than 40 dynes per centimeter.

Example 51 includes the subject matter of Example 50, and further specifies that the material has a surface energy that is less than 30 dynes per centimeter.

Example 52 includes the subject matter of any of Examples 43-51, and further specifies that the second component has a side surface and the material is proximate to the side surface.

Example 53 includes the subject matter of Example 52, and further specifies that the material is arranged in a line that is parallel to at least some of the side surface.

Example 54 includes the subject matter of Example 53, and further specifies that the line has a length that is a less than a length of the side surface.

Example 55 includes the subject matter of Example 54, and further specifies that the length of the line is less than or equal to one-half the length of the side surface.

Example 56 includes the subject matter of Example 54, and further specifies that the length of the line is less than or equal to one-third the length of the side surface.

Example 57 includes the subject matter of any of Examples 52-56, and further specifies that the line is spaced away from a footprint of the side surface by a distance between 0.5 millimeters and 1 millimeter.

Example 58 includes the subject matter of any of Examples 43-51, and further specifies that the second component has a first side surface and an opposing second side surface, the material includes a first portion and a second portion, the first portion is proximate to the first side surface, and the second portion is proximate to the second side surface.

Example 59 includes the subject matter of Example 58, and further specifies that the first portion is arranged in a line that is parallel to at least some of the first side surface, and the second portion is arranged in a line that is parallel to at least some of the second side surface.

Example 60 includes the subject matter of Example 59, and further specifies that the first portion has a length that is a less than a length of the first side surface, and the second portion has a length that is less than a length of the second side surface.

Example 61 includes the subject matter of Example 60, and further specifies that the length of the first portion is less than or equal to one-half the length of the first side surface, and the length of the second portion is less than or equal to one-half the length of the second side surface.

Example 62 includes the subject matter of Example 60, and further specifies that the length of the first portion is less than or equal to one-third the length of the first side surface, and the length of the second portion is less than or equal to one-third the length of the second side surface.

Example 63 includes the subject matter of any of Examples 58-62, and further specifies that the first portion is spaced away from a footprint of the first side surface by a distance between 0.5 millimeters and 1 millimeter, and the second portion is spaced away from a footprint of the second side surface by a distance between 0.5 millimeters and 1 millimeter.

Example 64 includes the subject matter of any of Examples 58-63, and further specifies that the first portion and the second portion are parallel.

Example 65 includes the subject matter of any of Examples 43-64, and further specifies that the underfill includes a tongue portion outside a footprint of the second component.

Example 66 includes the subject matter of Example 65, and further specifies that the material includes a first portion and a second portion, an end of the first portion is proximate to a first side of the tongue portion, and an end of the second portion is proximate to a second side of the tongue portion.

Example 67 includes the subject matter of any of Examples 65-66, and further specifies that the tongue portion is a first tongue portion, and the underfill includes a second tongue portion opposite to the first tongue portion.

Example 68 includes the subject matter of Example 67, and further specifies that the material includes a first portion and a second portion, an end of the first portion is proximate to a first side of the second tongue portion, and an end of the second portion is proximate to a second side of the second tongue portion.

Example 69 includes the subject matter of any of Examples 43-68, and further includes: a trench at a surface of the first component, wherein the trench surrounds the footprint of the second component, and the material is between the trench and the footprint of the second component.

Example 70 includes the subject matter of Example 69, and further specifies that the footprint of the second component is not centered within a perimeter of the trench.

Example 71 includes the subject matter of any of Examples 69-70, and further specifies that the footprint of the second component is spaced apart from a first proximate portion of the trench by a first distance, the footprint of the second component is spaced apart from a second proximate portion of the trench by a second distance, the first distance is less than the second distance, and the material is between the footprint of the second component and the first proximate portion of the trench.

Example 72 includes the subject matter of any of Examples 43-71, and further specifies that the first component is a package substrate or an interposer.

Example 73 includes the subject matter of any of Examples 43-72, and further specifies that the second component is a die or an interposer.

Example 74 includes the subject matter of any of Examples 43-73, and further includes: a lid coupled to the second component by a sealant different from the material.

Example 75 includes the subject matter of any of Examples 43-74, and further includes: a third component coupled to the surface of the first component, wherein the underfill does not extend between the third component and the first component.

Example 76 includes the subject matter of any of Examples 43-75, and further specifies that the first component is coupled to the second component by solder.

Example 77 includes the subject matter of any of Examples 43-76, and further includes: a mold compound over the second component, wherein the mold compound contacts the material.

Example 78 includes the subject matter of any of Examples 43-77, and further specifies that the material is a flow retardant material.

Example 79 includes the subject matter of any of Examples 43-78, and further specifies that the electronic assembly includes an integrated circuit package.

Example 80 includes the subject matter of any of Examples 43-79, and further includes: a circuit board, wherein the second component is electrically coupled to the circuit board.

Example 81 includes the subject matter of Example 80, and further specifies that the circuit board is a motherboard.

Example 82 includes the subject matter of any of Examples 80-81, and further includes: a display communicatively coupled to the circuit board.

Example 83 includes the subject matter of any of Examples 80-82, and further includes: one or more antennas communicatively coupled to the circuit board.

Example 84 includes the subject matter of any of Examples 43-83, and further specifies that the electronic assembly includes a server computing device, a laptop computing device, a tablet computing device, a wearable computing device, or a handheld computing device.

Example 85 is an electronic assembly, including: a first component; a second component; an underfill on the first component and at least partially between the first component and the second component; and a material at a surface of the first component, wherein the material is outside a footprint of the second component, a line of the material is parallel and proximate to a side surface of the second component, and a length of the line is less than a length of the side surface.

Example 86 includes the subject matter of Example 85, and further specifies that the underfill contacts the material.

Example 87 includes the subject matter of Example 86, and further specifies that the underfill contacts the material with a contact angle greater than 50 degrees.

Example 88 includes the subject matter of Example 87, and further specifies that the contact angle is greater than or equal to 60 degrees.

Example 89 includes the subject matter of any of Examples 85-88, and further specifies that the material includes a silicone, a polyurethane, a polyolefin, or an elastomer.

Example 90 includes the subject matter of Example 89, and further specifies that the material includes fluorine.

Example 91 includes the subject matter of any of Examples 85-90, and further specifies that the underfill includes an epoxy.

Example 92 includes the subject matter of Example 91, and further specifies that the underfill includes an epoxy-amine or an epoxy-anhydride.

Example 93 includes the subject matter of any of Examples 85-92, and further specifies that the material has a surface energy that is less than 40 dynes per centimeter.

Example 94 includes the subject matter of Example 93, and further specifies that the material has a surface energy that is less than 30 dynes per centimeter.

Example 95 includes the subject matter of any of Examples 85-94, and further specifies that the length of the line is less than or equal to one-half the length of the side surface.

Example 96 includes the subject matter of any of Examples 85-94, and further specifies that the length of the line is less than or equal to one-third the length of the side surface.

Example 97 includes the subject matter of any of Examples 85-96, and further specifies that the line is spaced away from a footprint of the side surface by a distance between 0.5 millimeters and 1 millimeter.

Example 98 includes the subject matter of any of Examples 85-97, and further specifies that the side surface is a first side surface, the line is a first line, the second component has a second side surface opposite to the first side surface, and the material includes a second line that is parallel and proximate to the second side surface.

Example 99 includes the subject matter of Example 98, and further specifies that the second line has a length that is less than a length of the second side surface.

Example 100 includes the subject matter of Example 99, and further specifies that second line has a length that is less than or equal to one-half the length of the second side surface.

Example 101 includes the subject matter of Example 99, and further specifies that the second line has a length that is less than or equal to one-third the length of the second side surface.

Example 102 includes the subject matter of any of Examples 98-101, and further specifies that the first line is spaced away from a footprint of the first side surface by a distance between 0.5 millimeters and 1 millimeter, and the second line is spaced away from a footprint of the second side surface by a distance between 0.5 millimeters and 1 millimeter.

Example 103 includes the subject matter of any of Examples 98-102, and further specifies that the first line and the second line are parallel.

Example 104 includes the subject matter of any of Examples 85-103, and further specifies that the material does not surround the footprint of the second component.

Example 105 includes the subject matter of any of Examples 85-104, and further specifies that the underfill includes a tongue portion outside a footprint of the second component.

Example 106 includes the subject matter of Example 105, and further specifies that the line is a first line, the material includes a second line of the material, an end of the first line is proximate to a first side of the tongue portion, and an end of the second line is proximate to a second side of the tongue portion.

Example 107 includes the subject matter of any of Examples 105-106, and further specifies that the tongue portion is a first tongue portion, and the underfill includes a second tongue portion opposite to the first tongue portion.

Example 108 includes the subject matter of Example 107, and further specifies that the line is a first line, the material includes a second line of the material, an end of the first line is proximate to a first side of the second tongue portion, and an end of the second line is proximate to a second side of the second tongue portion.

Example 109 includes the subject matter of any of Examples 85-108, and further includes: a trench at a surface of the first component, wherein the trench surrounds the footprint of the second component, and the material is between the trench and the footprint of the second component.

Example 110 includes the subject matter of Example 109, and further specifies that the footprint of the second component is not centered within a perimeter of the trench.

Example 111 includes the subject matter of any of Examples 109-110, and further specifies that the footprint of the second component is spaced apart from a first proximate portion of the trench by a first distance, the footprint of the second component is spaced apart from a second proximate portion of the trench by a second distance, the first distance is less than the second distance, and the material is between the footprint of the second component and the first proximate portion of the trench.

Example 112 includes the subject matter of any of Examples 85-111, and further specifies that the first component is a package substrate or an interposer.

Example 113 includes the subject matter of any of Examples 85-112, and further specifies that the second component is a die or an interposer.

Example 114 includes the subject matter of any of Examples 85-113, and further includes: a lid coupled to the second component by a sealant different from the material.

Example 115 includes the subject matter of any of Examples 85-114, and further includes: a third component coupled to the surface of the first component, wherein the underfill does not extend between the third component and the first component.

Example 116 includes the subject matter of any of Examples 85-115, and further specifies that the first component is coupled to the second component by solder.

Example 117 includes the subject matter of any of Examples 85-116, and further includes: a mold compound over the second component, wherein the mold compound contacts the material.

Example 118 includes the subject matter of any of Examples 85-117, and further specifies that the material is a flow retardant material.

Example 119 includes the subject matter of any of Examples 85-118, and further specifies that the electronic assembly includes an integrated circuit package.

Example 120 includes the subject matter of any of Examples 85-119, and further includes: a circuit board, wherein the second component is electrically coupled to the circuit board.

Example 121 includes the subject matter of any of Examples 120, and further specifies that the circuit board is a motherboard.

Example 122 includes the subject matter of any of Examples 120-121, and further includes: a display communicatively coupled to the circuit board.

Example 123 includes the subject matter of any of Examples 120-122, and further includes: one or more antennas communicatively coupled to the circuit board.

Example 124 includes the subject matter of any of Examples 85-123, and further specifies that the electronic assembly includes a server computing device, a laptop computing device, a tablet computing device, a wearable computing device, or a handheld computing device.

The invention claimed is:

1. An electronic assembly, comprising:
   a first component;
   a second component;
   an underfill on the first component and at least partially between the first component and the second component; and
   a material at a surface of the first component, wherein the material is outside a footprint of the second component, and the underfill contacts the material with a contact angle greater than 50 degrees;
   wherein the material includes a silicone, a polyurethane, a polyolefin, or an elastomer.

2. The electronic assembly of claim 1, wherein the contact angle is greater than or equal to 60 degrees.

3. The electronic assembly of claim 1, wherein the material includes fluorine.

4. The electronic assembly of claim 1, wherein the underfill includes an epoxy.

5. An electronic assembly, comprising:
   a first component;
   a second component;
   an underfill on the first component and at least partially between the first component and the second component; and
   a material at a surface of the first component, wherein the material is outside a footprint of the second component, and the underfill contacts the material with a contact angle greater than 50 degrees;
   wherein the material has a surface energy that is less than 40 dynes per centimeter.

6. The electronic assembly of claim 5, wherein the material has a surface energy that is less than 30 dynes per centimeter.

7. An electronic assembly, comprising:
   a first component;
   a second component;
   an underfill on the first component and at least partially between the first component and the second component; and
   a material at a surface of the first component, wherein the material is outside a footprint of the second component, the material does not surround the footprint of the second component, and the underfill contacts the material, wherein:
   the second component has a side surface and the material is proximate to the side surface;
   the material is arranged in a line that is parallel to at least some of the side surface; and
   the line has a length that is a less than a length of the side surface.

8. The electronic assembly of claim 7, wherein the length of the line is less than or equal to one-half the length of the side surface.

9. An electronic assembly, comprising:
   a first component;
   a second component;
   an underfill on the first component and at least partially between the first component and the second component; and
   a material at a surface of the first component, wherein the material is outside a footprint of the second component, the material does not surround the footprint of the second component, and the underfill contacts the material, wherein:
   the second component has a side surface and the material is proximate to the side surface;
   the material is arranged in a line that is parallel to at least some of the side surface; and
   the line is spaced away from a footprint of the side surface by a distance between 0.5 millimeters and 1 millimeter.

10. An electronic assembly, comprising:
    a first component;
    a second component;
    an underfill on the first component and at least partially between the first component and the second component; and
    a material at a surface of the first component, wherein the material is outside a footprint of the second component, a line of the material is parallel and proximate to a side surface of the second component, and a length of the line is less than a length of the side surface.

11. The electronic assembly of claim 10, wherein the side surface is a first side surface, the line is a first line, the second component has a second side surface opposite to the first side surface, and the material includes a second line that is parallel and proximate to the second side surface.

12. The electronic assembly of claim 11, wherein the first line and the second line are parallel.

13. The electronic assembly of claim 10, wherein the material does not surround the footprint of the second component.

14. The electronic assembly of claim 10, wherein the underfill includes a tongue portion outside a footprint of the second component.

15. The electronic assembly of claim 14, wherein the line is a first line, the material includes a second line of the material, an end of the first line is proximate to a first side of the tongue portion, and an end of the second line is proximate to a second side of the tongue portion.

16. The electronic assembly of claim 14, wherein the tongue portion is a first tongue portion, and the underfill includes a second tongue portion opposite to the first tongue portion.

* * * * *